United States Patent [19]
Kato et al.

[11] Patent Number: 5,316,839
[45] Date of Patent: May 31, 1994

[54] HEAT RESISTANT, FLAME RESISTANT CONDUCTING SHEET HAVING AN ELECTRICAL INSULATION LAYER

[75] Inventors: Ippei Kato, Nagaizuni; Akiyoshi Takano, Fuji, both of Japan

[73] Assignees: E. I. Du Pont de Nemours and Company, Wilmington, Del.; Mishima Paper Company Ltd., Fuji, Japan

[21] Appl. No.: 68,271

[22] Filed: May 26, 1993

Related U.S. Application Data

[63] Continuation of Ser. No. 714,873, Jun. 13, 1991, abandoned.

[30] Foreign Application Priority Data

Jul. 24, 1990 [JP] Japan .................................. 2-193809

[51] Int. Cl.$^5$ .......................... B32B 15/14; B32B 5/06; B27N 9/00; D21F 11/02

[52] U.S. Cl. ..................... 428/285; 162/125; 162/129; 162/132; 162/138; 162/157.3; 428/286; 428/287; 428/296; 428/297; 428/298; 428/302; 428/408; 428/902; 428/903; 428/920; 428/284

[58] Field of Search ............... 428/286, 296, 297, 298, 428/302, 287, 408, 903

[56] References Cited

U.S. PATENT DOCUMENTS

| | | | |
|---|---|---|---|
| 4,534,886 | 8/1985 | Kraus et al. | 252/502 |
| 4,541,894 | 9/1985 | Cassat | 428/901 |
| 4,726,987 | 2/1988 | Trask et al. | 428/921 |
| 5,098,778 | 3/1992 | Minnick | 428/284 |

FOREIGN PATENT DOCUMENTS

| | | |
|---|---|---|
| 49-94904 | 9/1974 | Japan . |
| 51-47103 | 4/1976 | Japan . |
| 57-115702 | 7/1982 | Japan . |
| 1-132898 | 5/1989 | Japan . |

*Primary Examiner*—James D. Withers

[57] ABSTRACT

A laminate suitable for electrostatic discharge interference and/or electromagnetic interference shielding comprising a polymetaphenylene isophthalamide fiber layer on one or both sides of a conducting layer comprising conducting fibers and polymetaphenylene isophthalamide fibers.

4 Claims, 6 Drawing Sheets

HEAT RESISTANT, FLAME RESISTANT CONDUCTING SHEET HAVING AN ELECTRICAL INSULATION LAYER

This is a continuation, of application Ser. No. 07/714,873 filed Jun. 13, 1991, now abandoned.

BACKGROUND OF THE INVENTION

The present invention relates to a heat- and flame-resistant conducting sheet which is suitable for electrostatic discharge interference and/or electromagnetic interference shielding or for covering a source electronic device, particularly for use in proximity to said device, and which has a highly heat- and flame-resistant self-extinguishing electrically insulating layer; and a manufacturing process thereof.

Recent developments in the microelectronic technology have resulted in a broad range of electronic devices that are sensitive to external electromagnetic waves and that themselves transmit unwanted electromagnetic waves. In addition, an extensive use of plastics in electronic devices makes them easily statically charged in contact with an electrical insulator to readily cause electrostatic and electromagnetic interferences. In addition, they themselves are vulnerable to electromagnetic interference, causing these devices to behave erratically.

Measures to attenuate these electromagnetic and electrostatic charge-discharge interference problems include using a variety of conducting sheets. Particularly, when a conducting sheet is used for electromagnetic interference shielding, it is often located in close proximity to or in contact with an electrical circuit acting as a source of such electromagnetic waves. This manifests a danger of the conducting sheet coming into contact with the electrical circuit, thereby electrically short-circuiting. That is why it is essential for the surface of an electromagnetic shield material and an electromagnetic shielding housing to be electrically insulating. There is also a fire hazard if an electrical shortening occurs. In addition, the generation of heat from the electrical circuit requires using a highly heat- and flame-resistant conducting sheet for preventing fires. For example, Japanese Patent Application Publication Kokai 51-47103 and 57-115702 teach a heat resistant conducting paper based on aromatic polymer pulp and conducting fibers. A flame resistant or noncombustible structure is known in the art: for example, Kokai 63-209199 teaches a sheet-like electromagnetic shield structure in which metal foil is bonded through an adhesive to one side of a sheet-like structure, for example, paper or nonwoven fabrics. Kokai 49-94904 teaches a sheet obtained by treating with heat and pressure a mixture of aromatic polyamide pulp granules with short aromatic polyester fibers, inorganic fibers, and the like. A heat- and flame-resistant paper is, for example, taught in Kokai 1-132898: a heat- and flame-resistant paper composed of a heat resistant polyether imide resin.

However, the above prior art sheet materials used for electrostatic or electromagnetic interference shielding are deficient, particularly when used in close proximity to an electronic device acting as a source of electrostatic or electromagnetic interference. For example, a conducting paper based on aromatic polymer pulp and conducting fibers has the drawback of short circuiting the electronic device because the conducting fibers tend to drop off. In addition, a composite sheet material obtained by bonding metal foil by an adhesive to one side of paper or nonwoven fabric is deficient in that it lacks bending characteristics, is poor in heat resistance, and shows reduced heat- and flame-resistant due to the use of adhesives. Furthermore, a composite product obtained by bonding with an adhesive a conducting sheet to a heat- and flame-resistant aromatic polyamide or polyether imide paper suffers from a loss in heat resistance and flame resistance due to the presence of an adhesive, which makes such use a hindrance in the formation of a heat- and flame-resistant conducting sheet.

The present inventors have studied to develop a highly heat- and flame-resistant and electrically insulating conducting sheet for solving the above prior art problems, and as a result, they have arrived at this invention.

SUMMARY OF THE INVENTION

This invention relates to a heat- and flame-resistant conducting sheet having an electrically insulating layer, comprising a laminate of poly-meta-phenylene isophthalamide fiber layer to one or both sides of a conducting layer composed of conducting fibers and poly-meta-phenylene isophthalamide fibers. It also concerns processes for the manufacture of heat- and flame-resistant conducting sheets having electrically insulating layers.

DETAILED DESCRIPTION OF THE INVENTION

One process of this invention for the manufacture of a heat- and flame-resistant conducting sheet having an electrically insulating layer, comprises laying a wet web from a poly-meta-phenylene isophthalamide fiber paper stock over one or both sides of a wet web from a blend stock of conducting fibers and polymetaphenylene isophthalamide fibers, subjecting to papermaking into a paper web, and laminating with heat and pressure at or above the glass transition temperature of the polymetaphenylene isophthalamide fiber.

A second process of this invention for the manufacture of a heat- and flame-resistant conducting sheet having an electrically insulating layer, comprises laying a paper web prepared by papermaking from a polymetaphenylene isophthalamide fiber paper stock over one or both sides of a paper web obtained by papermaking from a blend stock of conducting fibers and polymetaphenylene isophthalamide fibers and laminating with heat and pressure at or above the glass transition temperature of the polymetaphenylene isophthalamide fiber.

The conducting fibers used in this invention are metal fibers, metal-coated fibers, carbon fibers, and the like, which are blendable with polymetaphenylene isophthalamide fibers and capable of papermaking: for example, the metal fibers include stainless steel fibers (hereafter SUS fibers). nickel fibers (hereafter Ni fibers), copper fibers (hereafter Cu fibers), aluminum fibers (hereafter Al fibers), and the like.

The most preferred of these metal fibers are SUS fibers such as Naslon ® of Nippon Seisen K.K., in terms of dispersibility in water, papermaking characteristics, such as durability against shear force in water, conductivity, resistance to oxidation, ease of handling, and the like. Ni fibers are somewhat inferior in their papermaking characteristics due to their softness and tendencies for entanglements and breakage, but have good conductivity and resistance to oxidation, and the like, to make them a type of preferred conducting fibers: for example, Ni fibers of Nippon Seisen K.K. Cu fibers and Al fibers with possibilities of decreased conductivities on oxidation may be used, but they are limited in terms of fiber handling in papermaking or in applications of sheets prepared therefrom. Some Cu fibers, for example, Esko Company's Caplo ®, available in heavy gauge, tend to sink in water, thus requiring care in handling in papermaking.

The metal coated fibers that can be used include, for example, nickel-coated carbon fibers (hereafter abbreviated as Ni-CF fibers), copper-covered carbon fibers (hereafter abbreviated as Cu-CF fibers), aluminum-covered carbon fibers (hereafter abbreviated as Al-CF fibers), and nickel-, copper- and aluminum-covered glass fibers, and the like. In terms of conductivities, Ni-CF fibers are most preferred. Papermaking-conditions must be selected with care for Cu-CF fibers and Al-CF fibers due to their possible loss of conductivities on oxidation, and of metal-covered glass fibers for their possibility of breaking. Chemically plated nickel and electroplated nickel Ni-CF fibers are known and both can be suitably used: for example, the chemically plated Ni-CF fiber product of Mitsubishi Rayon K.K. and electroplated Ni-CF fiber product of Toho Rayon K.K. called BESFIGHT ®-MC.

Carbon fibers that can be used range from those fired at relatively low temperatures not higher than about 1400° C. to those of graphite types obtained by firing at higher temperatures. These may be derived from any starting materials, such as pitch, rayon, acrylonitrile types, and the like, for example: Carbon Fiber Chop ® C-203 of Kureha Kagaku K.K. and Carbonic ® of Petoka K.K.; and acrylonitrile type carbon fibers such as PYROFIL ® of Mitsubishi Rayon K.K. and HICARBORON ® of Asahi Chemicals.

The polymetaphenylene isophthalamide fibers (hereafter meta-aramid fibers) used in this invention are those based on aromatic metapolyamide components and suitable for papermaking, such as fibrids (pulp-like materials; pulp-like fine fibers), as well as flocks based on the same material (synthetic fiber material: spun filaments cut into fibers): for example, the product of E. I. du Pont de Nemours & Company (hereafter DuPont), Nomex ® Flock and Nomex ® Fibrid. The conducting layer of the heat- and flame-resistant conducting sheet having an electrically insulating layer of this invention is a conducting layer (hereafter called conducting aramid layer) obtained by papermaking from a blend of fibrid (pulp) based on aramid fibers, that is, an aromatic metapolyamide component or from a blend of said fibrid (pulp), flock (synthetic fiber product) based on the same component, and conducting fibers, wherein no binder is particularly used for bonding these two fibers together. The suitable basis weight of the conducting aramid layer is 25-200 gram/m². Sheets used for electrostatic discharge interference prevention (hereafter ESD prevention) suitably contain conducting fibers totalling 0.3-8 gram/m². Sheets for electromagnetic interference shielding effect (EMI shield effect) suitably contain conducting fibers totalling 8-170 gram/m² (hereafter gram/m² is abbreviated as g/m²).

As examples of compositions for conducting aramid layers, an ESD preventive application uses a composition comprising 15-1% by weight of conducting fibers, 15-99% by weight of fibrids, and 0-84% by weight of flocks. EMI shield application composition comprises 85-15% by weight of conducting fibers, 15-85% by weight of fibrids and 0-70% by weight of flocks. At least 15% by weight of fibrids is needed for achieving good papermaking capability.

The meta-aramid fiber layer (hereafter aramid layer) to be laminated onto one or both sides of the conducting layer is generated by papermaking from an aromatic metapolyamide fibrid (pulp) or a blend of said fibrid (pulp product) and flock (synthetic fibers) based on the same material, without using any papermaking binder other than aramid itself. A suitable basis weight is 25-200 g/m² for a composition of 15-100% by weight of fibrids and 85-0% by weight of flock.

The aramid layer is described for its properties, illustrated for DuPont Company's Nomex ® aramid paper (T410).

Nomex ® aramid paper is UL rated for its heat resistance (Underwriters Laboratories, Inc.) for continuous use up to temperatures of 220° C. For electrical insulation properties, there are also a large number of UL approved insulation methods for a 130° C.-220° C. class up to an electrical voltage of 34.5 kV comprised of wires, enamels, sleeves, spacers, tapes, binding wires, varnish and potting compounds used with Nomex ® paper. Said paper has heat resistance meeting UL 94 V-0, exhibiting excellent self-extinguishing properties. As will be evident from the later experimental examples, a high degree of flame resistance and electrical insulation suitably requires the basis weight of the aramid layer laminated to the conducting aramid layer to total 115 g/m² or greater.

Thus, aramid paper, when used, for example, as an electrical insulation material in a capacitor, exhibits high electrical insulation properties as well as a high degree of heat- and flame-resistance, so that a sheet consolidated from an aramid layer and a conducting layer is a conducting sheet which is both electrically insulating and heat- and flame-resistant. This gives a heat- and flame-resistant conducting sheet having the electrically insulated layer of this invention.

As described above, an ESD application requires the total conducting fibers in the conducting aramid layer to be 0.3-8 g/m². As will be shown by later experimental examples, an ESD prevention application requires the area resistivity of the conducting layer to be not more than $10^5$ ohm/□, which can be reached by having total conducting fibers of 0.3-8 g/m². A level exceeding 8 g/m² is certainly allowed but not preferred in terms of the cost of the conducting fibers. An EMI shielding application requires the total conducting fibers in the conducting aramid layer to be suitably 8-170 g/m². This range, as will be shown by later experimental examples, is optimum for bringing the area resistivity of the conducting layer to no more than $3 \times 10^0$ ohm/□ to satisfy the generally required EMI shield effect of a conducting sheet, which is at least 25 decibels (dB), suitably at least 30-40 decibels (dB), for electromagnetic waves at 500-1,000 MHz. In other words, the heat- and flame-resistant conducting sheet having an electrically insulated layer of this invention for an ESD application requires the total amount of the conducting fibers to be 0.3-8 g/m$^2$ and the area resistivity of the conducting layer to be not more than $10^5$ ohm/□, while an EMI shielding application requires the total amount of conducting fibers to be 8-170 g/m$^2$ and the area resistivity of the conducting layer to be not more than $3 \times 10^0$ ohm/□.

A description has been made of a conducting sheet obtained by laminating an aramid layer to one or both sides of a conducting aramid layer, but the invention is not limited to the two or three layers, to allow laminating more than three layers to give a heat- and flame-resistant conducting sheet having electrically insulated layers.

Heat- and flame-resistant conducting sheets having electrically insulated layers of this invention are prepared by the following methods.

The heat- and flame-resistant conducting sheet having an electrically insulating layer of this invention is prepared essentially by applying papermaking techniques:

In Process 1, first of all for preparing paper stocks: the conducting aramid layer is prepared by agitating conducting fibers, fibrids, and flocks in water. For the aramid layer, its fibrids and flocks are agitated in water. Then, a multilayer papermaking technique is used to lay down an aramid layer over one or both sides of the conducting aramid layer to generate a multilayer formation on a papermaking machine. A multilayered wound paper web is then continuously processed on a heat processing machine, continuous or discontinuous to the papermaking machine, continuously with heat and pressure at least to a temperature as high as the glass transition temperature of aramid, 275° C. into a laminate product of this invention. A multilayered paper web may be cut, and the flat sheets treated with heat and pressure. Using no adhesive in the above multilayer formation characterizes the present manufacturing process.

In said manufacturing process 1, the multilayer formation may be obviously carried out by any method: a cylinder machine paper making, long screen (equivalent to "FOURDRINIER"), papermaking with a multi-slice headbox, and a combination method thereof.

Manufacturing process 2 comprises papermaking from a paper stock prepared according to the stock preparation in the above manufacturing process 1 as a conducting aramid paper or aramid paper, followed by winding up individual paper webs. Laminating the resultant aramid paper to one or both sides of the conducting aramid paper with heat and pressure similarly to that of manufacturing process 1 gives a laminated product of this invention. Using no adhesive in lamination in manufacturing process 2 also characterizes the present invention.

As described above, the present invention relates to a heat- and flame-resistant conducting sheet having an electrically insulating layer, which provides the following advantages:

Firstly, the conducting layer, having a total amount of conducting fibers of 0.3-8 g/m$^2$ and having an area resistivity for said layer of not more than $10^5$ ohm/□ is capable of shielding electronic devices from electrostatic charge-discharge interference; is electrically insulating at least at its side in contact with the electronic device to eliminate any electrical short circuiting danger, even when coming in contact with the electronic device; is heat resistant even when subjected to hazardous situations; and is self-extinguishing, so as not to support combustion.

Secondly, the conducting layer, having a total amount of conducting fibers of 8-170 g/m$^2$ and has an area resistivity for said layer of not more than $3 \times 10^0$ ohm/□ area, is capable of shielding an electronic device from external electromagnetic waves nd sealing off any internally generated electromagnetic wave from being transmitted out of the device to cause any interference problems on other electronic devices; and is effective, as in the case of invention 1, for preventing any electrical short-circuiting by its electrically insulating properties and any fires due to its heat- and flame-resistance, and the like.

The heat- and flame-resistant conducting sheet having an electrically insulating layer of this invention and processes for manufacture thereof are described by the following experimental examples and examples.

EXPERIMENTAL EXAMPLE 1

The paper stocks used were prepared aromatic metapolyamide fibers: Nomex ® Flock (DuPont Company, average fiber length 6.8 mm, polymetaphenylene isophthalamide type, hereafter simply called Flock), and Nomex ® Fibrid (DuPont Company, polymetaphenylene isophthalamide type, hereafter simply called Fibrid).

The conducting fibers used were stainless steel fibers (NASLON ®. Nippon Seisen K.K., fiber length 5 mm, 316 L stainless steel, diameter 8 micrometer, density 7.9, fiber resistivity $7.2 \times 10^{-5}$ ohm.cm; hereafter called SUS fibers), nickel fibers (Nipon Seisen K.K., average fiber length 5 mm. diameter 8.3 micrometer, density 8.9, fiber specific resistance $7.2 \times 10^{-6}$ ohm.cm; hereafter simply Ni fibers), chemically plated nickel-covered carbon fibers (Mitsubishi Rayon K.K., average fiber length 4 6 mm, diameter 7.4 micrometer, density 2.5, fiber specific resistivity $3.3 \times 10^{-4}$ ohm.cm; hereafter simply chemically plated Ni-CF fibers), electroplated nickel-covered carbon fibers (BESTFIGHT ® MC), Toho Rayon, average fiber length 6 mm, diameter 7.5 micrometer, density 2.7, fiber resistivity $7.5 \times 10^{-5}$ ohm.cm; hereafter simply electroplated Ni-CF fibers), and carbon fibers PYROFIL ® TR005, Mitsubishi Rayon K.K.. PAN type CF, fiber length 6 mm, diameter 7 micrometer, specific gravity 1.8, fiber specific resistivity $1.5 \times 10^{-3}$ ohm.cm; hereafter simply CF fibers).

The paper stock for the aramid layer was prepared by first agitating Fibrid in water at a 1% concentration for 5 minutes, followed by adding Flock and further agitating for 5 minutes.

The paper stock for the conducting aramid layer was prepared by first agitating Fibrid in water at a 1% concentration for 5 minutes followed by adding conducting fibers predispersed in water, agitating for 5 minutes, adding Flock, and further agitating for 5 minutes.

The aramid layer was prepared by papermaking from a paper stock comprising 60% by weight of Flock and 40% by weight of Fibrid on a Tappi standard type sheet machine with the basis weight aimed at 40 g/m², which was obtained as a wet web.

The conducting aramid layer was prepared from 0–30 volume % of conducting fibers suitably blended with 40% by volume of Fibrid and 60–30% by volume of Flock by papermaking on a Tappi standard sheet machine, aimed at reaching a basis weight of 50 g/m² into a wet web.

The above pre-paper made wet web aramid layer and the conducting wet web aramid layer were combined followed by laying down an additional wet web aramid layer to generate a three-layer blended paper composition of an aramid layer/conducting aramid layer/ aramid layer. The three-blended-layer paper was dewatered and dried at 105° C.

The three-blended-layer paper was treated with heat and pressure at 300° C. under a pressure of 30 kg/cm² for 1 minute 30 seconds on a hot press machine to generate a conducting aramid sheet having electrical insulating layers on both sides thereof.

Figure 1:
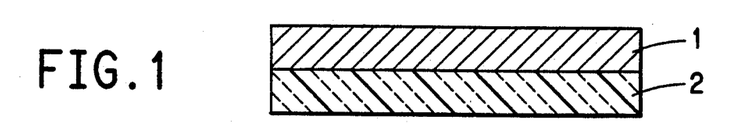
FIGS. 1, 2, 3, and 4 illustrate the cross sectional structures of heat- and flame-resistant conducting sheets having electrically insulated layers of this invention. In the Figures, 1: conducting layer (conducting aramid layer) and 2: electrically insulating layer (aramid layer).
Figure 2:
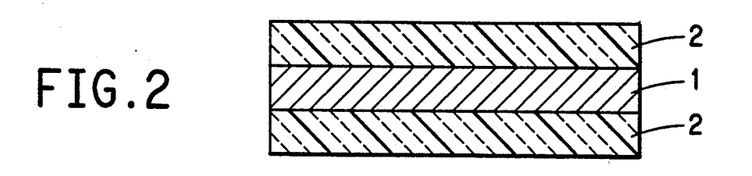
Figure 3:
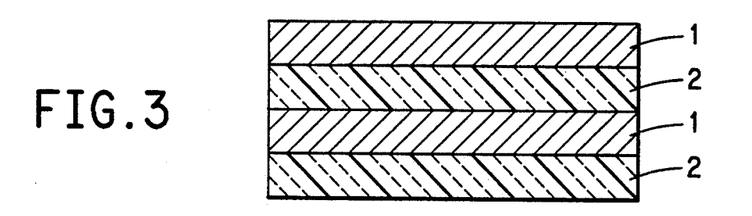
Figure 4:
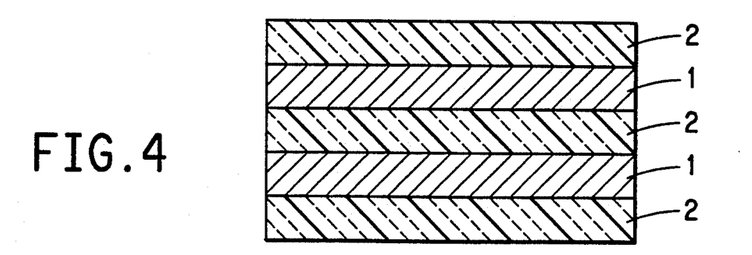
Figure 5:
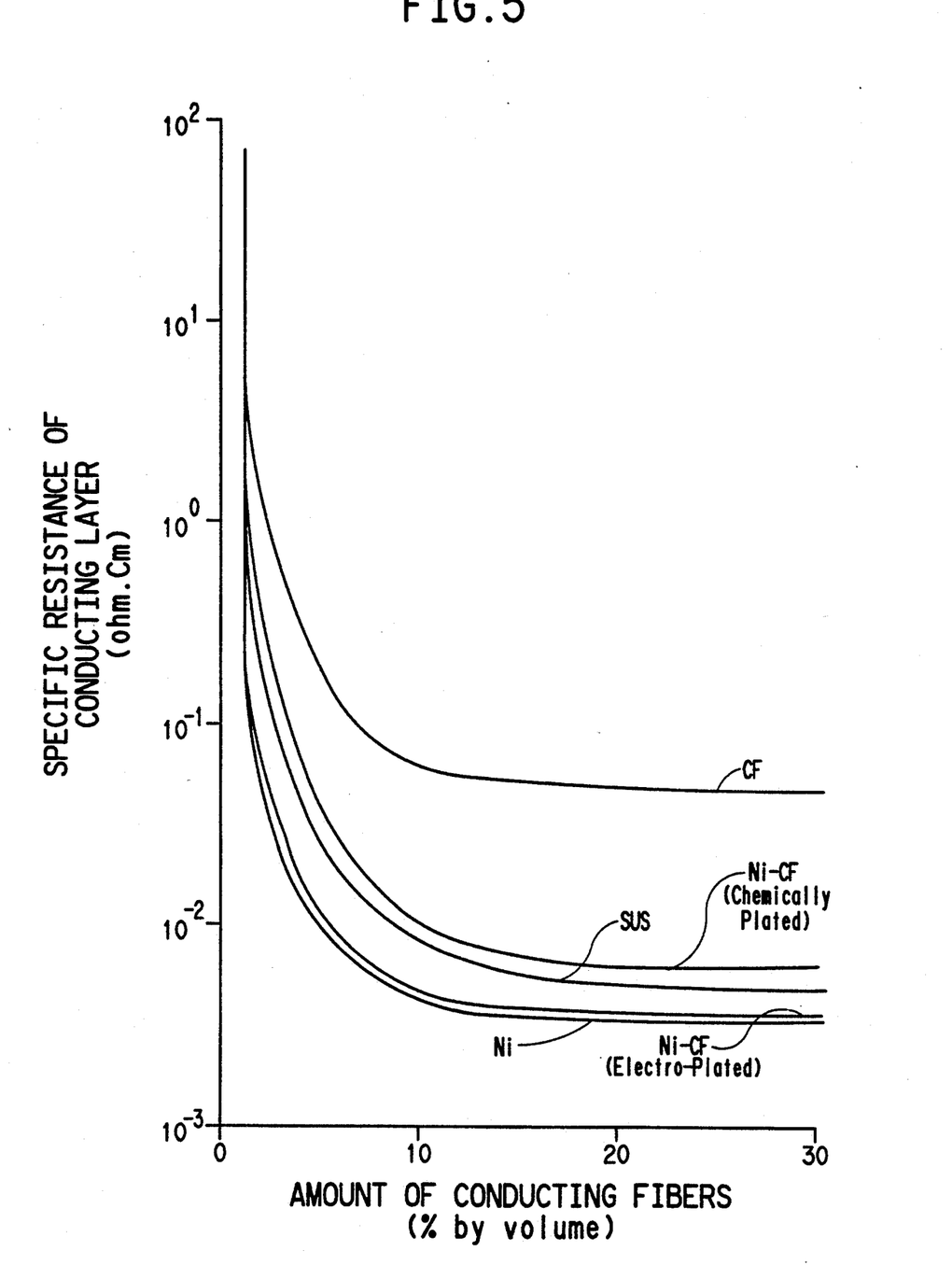
FIG. 5 is a graph relating the amount of conducting fibers to the specific resistance of the conducting layers.

FIG. 5 shows the relationships between the amounts of various conducting fibers (% by volume) and the specific resistance (ohm.cm) of the conducting layers. The specific resistance, $\rho$(ohm.cm) of the conducting layers was measured according to SRIS2301 by applying thickness t (cm) of the conducting layer. FIG. 5 shows that although the density of each conducting fiber is different, the specific resistance rapidly changes at a 0.8 volume % loading and begins to show a saturation at 10 volume %. Table 1 summarizes the saturated value of the specific resistance of conducting layers for these conducting fibers.

Table 1 shows that the saturation values for specific resistance for conducting layers vary, although they are related to the specific resistance values of the conducting fibers.

The above method was used to prepare a three-layer blended paper from a conducting aramid layer of 20–50% by weight of conducting fibers, 40% by weight of Fibrid and 10–40% by weight of Flock, aimed at a basis weight of 50 g/m² or 100 g/m² by treating with heat and pressure, to give conducting aramid sheets having electrical insulation layers on both sides thereof, on which measurements were made, as also reported in Table 1.

Figure 6:
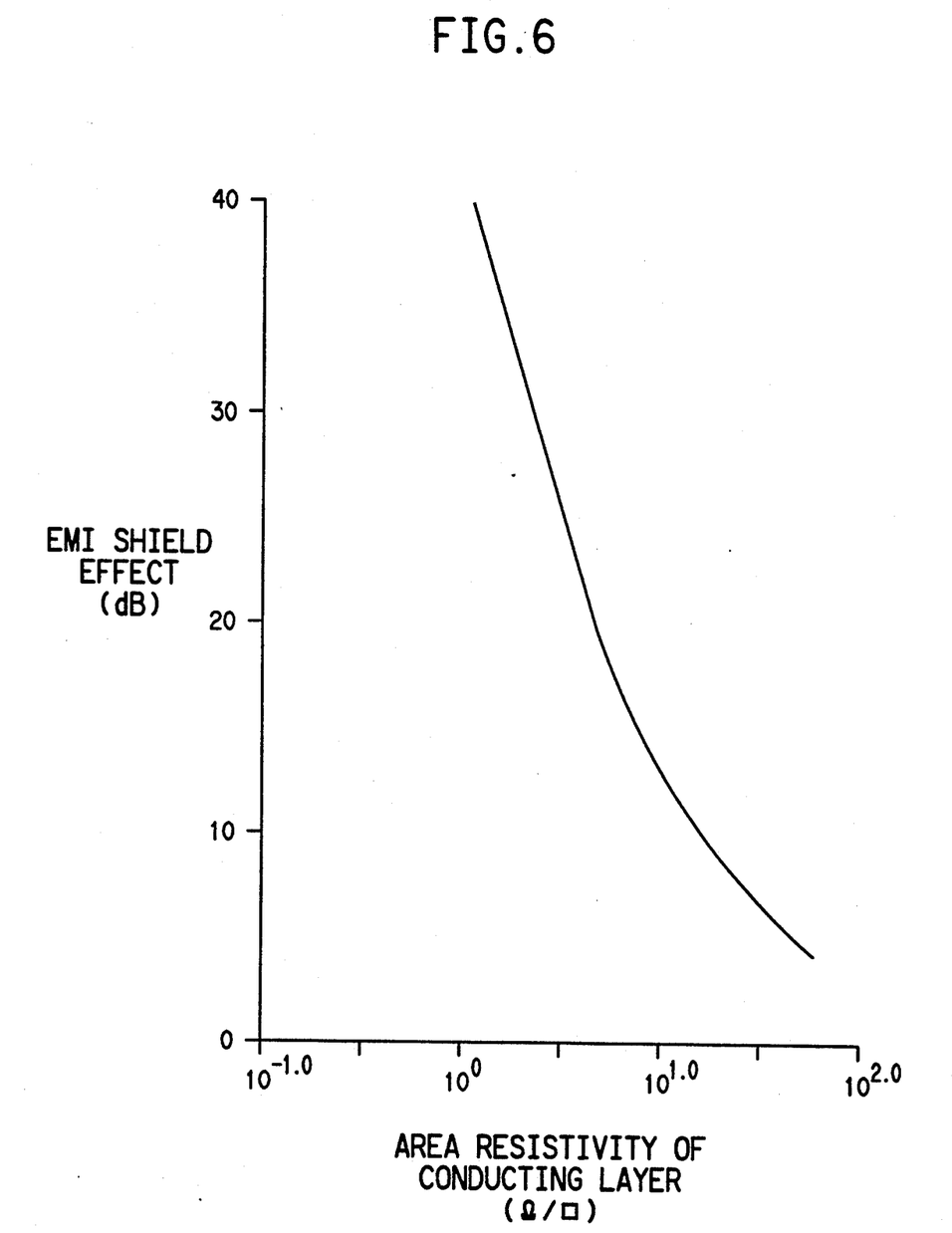
FIG. 6 is a graph showing the relationship between the area resistivity of the conducting layers and the EMI shield effect.

As shown by FIG. 6, the area resistivity for the conducting layer (ohm/□) is related to an EMI shield effect (dB). From FIG. 6, it can be estimated that an EMI shield effect of 20 dB requires a resistivity of $5 \times 10^0$ ($10^{0.7}$) ohm/□; for 25 dB, $3 \times 10^0$ ($10^{0.5}$) ohm/□; and for 40 dB, $1 \times 10^0$ ($10^0$) ohm/□.

Table 1 was used to calculate the total amounts of conducting fibers needed for an EMI shielding effect of at least 25 dB ($3 \times 10^0$ ohm/□) as a practical EMI shield material; they were at least 35 g/m² for the CF fibers; at least 11 g/m² for Ni-CF (chemically plated); at least 8 g/m² for Ni-CF (electroplated); at least 15 g/m² for SUS fibers; and at least 16 g/m² for the Ni fibers. Thus, an EMI shield application requires a total amount of conducting fibers of at least 8 g/m², where a suitable blending recipe for the conducting aramid layer is 85–15% by weight of conducting fibers, 15–80% by weight of Fibrid, and 0–70% by weight of Flock. In terms of papermaking, the suitable basis weight is at least 25 g/m².

TABLE 1

| Properties of Conducting Fibers Used in | | | Properties of Conducting Aramid Layers at Initial Saturation of Resistivities (10 volume %–50 g/m²) | | | | |
|---|---|---|---|---|---|---|---|
| | | | Sheet Resistivity | | | Total Amount | EMI |
| Type | Specific Gravity | Specific Resistance (ohm/cm) | Specific Resisance (ohm/cm) | Area Resistivity (ohm/□) | % By Weight | of Conducting Fiber (g/m²) | Shield Effect (dB) |
| CF | 1.8 | $1.5 \times 10^{-3}$ | $4.0 \times 10^{-2}$ | $8.0 \times 10^0$ | 12.7 | 6.4 | 15 |
| Ni—CF (Chemically Plated) | 2.5 | $3.3 \times 10^{-4}$ | $1.5 \times 10^{-2}$ | $2.9 \times 10^0$ | 16.4 | 8.2 | 22 |
| Ni—CF (Electroplated) | 2.7 | $7.5 \times 10^{-5}$ | $6.5 \times 10^{-3}$ | $1.3 \times 10^0$ | 17.9 | 8.9 | 29 |
| SUS | 7.8 | $7.2 \times 10^{-5}$ | $1.2 \times 10^{-2}$ | $2.3 \times 10^0$ | 38.9 | 19.5 | 27 |
| Ni | 8.9 | $7.2 \times 10^{-6}$ | $5.0 \times 10^{-3}$ | $1.0 \times 10^0$ | 41.8 | 20.9 | 30 |

| Properties of Conducting Aramid Layers for Aramide Layer/Conducting Layer/Aramid Layer | | | | |
|---|---|---|---|---|
| Basis Weight (g/m²) | Weight (%) | Total Amount of Conducting Fibers (g/m²) | Area Resistivity (ohm/□) | EMI Shielding Effect (dB) |
| 46.0 | 50 | 23 | $3.5 \times 10^0$ | 22.3 |
| 85.2 | 50 | 42.6 | $1.8 \times 10^0$ | 27.0 |
| 48.0 | 20 | 9.6 | $2.7 \times 10^0$ | 23.5 |
| 96.3 | 20 | 19.3 | $1.5 \times 10^0$ | 31.5 |
| 48.4 | 30 | 14.5 | $5.0 \times 10^{-1}$ | 29.5 |
| 49.5 | 20 | 9.9 | $9.8 \times 10^{-1}$ | 31.5 |
| 95.1 | 20 | 19.0 | $5.1 \times 10^{-1}$ | 36.0 |
| 46.9 | 30 | 14.1 | $6.2 \times 10^{-1}$ | 31.5 |
| 49.4 | 50 | 24.7 | $2.2 \times 10^0$ | 28.0 |
| 93.0 | 50 | 46.5 | $1.3 \times 10^0$ | 35.0 |
| 48.0 | 50 | 24.0 | $8.5 \times 10^{-1}$ | 32.0 |
| 103.0 | 50 | 51.5 | $5.8 \times 10^{-1}$ | 34.0 |

In the table the area resistivity. Rs (ohm/□ for a conducting layer was calculated by the relationship, $\rho/t$. The EMI shield effect was measured on a $15 \times 15$ cm sample using an ADVANTEST TR17301 Plastic Shielding Effect Device and was reported in terms of an electrolytic shield effect (dB) at 1000 MHz.

Table 2 shows the % by weight of each conducting fiber and the total amount of conducting fibers at a 0.8% by volume loading, at which resistivity changes rapidly. The % by volume is that concentration at which conducting fibers come in contact with each other, and is considered to be the lowest limit, above which these conducting fibers must be blended in for preventing ESD. Therefore, the suitable total amount of conducting fiber is at least 0.3 g/m², in which the conducting aramid layer, for example, comprises 15–1% by weight of conducting fibers, 15–99% by weight of Fibrid, and 0–84% by weight of Flock, with a basis weight of at least 25 g/m² for the ease of papermaking.

There is no upper limit to the total amount of the conducting fiber. Economically, it should be up to 8 g/m².

TABLE 2

| Conducting Fibers | | | Amount of Conducting Fibers Needed (25 g/m² Sheet) |
|---|---|---|---|
| Types | Specific Gravity | % by Weight at 0.8% by Volume | |
| CF | 1.8 | 1.1 | At least 0.28 g |
| Ni—CF (Chemical Plated) | 2.5 | 1.4 | At least 0.35 g |
| Ni—CF (Electro-Plated) | 2.7 | 1.6 | At least 0.40 g |
| SUS | 7.8 | 4.4 | At least 1.10 g |
| Ni | 8.9 | 4.9 | At least 1.23 g |

EXPERIMENTAL EXAMPLE 2

Table 3 shows the electrical breakdown voltage (kv/mm), flame resistance, and heat resistance of a Nomex ® aramid sheet which meets UL94VO. While Table 3 shows that Nomex ® has UL94VO flame resistance, the conducting aramid sheet, which contains highly thermally-conductive conducting fibers in the conducting layer, should preferably have on one or both sides thereof thicker electrically insulated layers. An example is given below.

A paper stock was prepared by dispersing Fibrid at a 1% concentration for 20 minutes in a pulper, followed by adding predispersed SUS fibers, agitating for 20 minutes, adding Flock, and further agitating for 10 minutes. The resultant paper stock was then subjected to papermaking using a cylinder paper making machine to give a conducting aramid paper with goal basis weights of 50 g/m² and 100 g/m².

Said conducting aramid paper had a composition of 50% by weight of SUS fibers, 40% by weight of Fibrid, and 10% by weight of Flock.

Onto one side of the resultant conducting aramid paper was laid down Nomex ® aramid paper 7 MIL thick T411, or else Nomex ® aramid paper 6 MIL thick T411 was laid down over both sides of the resultant conducting aramid paper; this was followed by subjecting each to hot calendaring, respectively, at 320° C. under a linear pressure of 125 kg/cm² to give a conducting aramid sheet having an electrically insulated layer on one side thereof or a conducting aramid sheet having electrically insulated layers on both sides thereof.

Table 4 summarizes the properties of the resultant sheets with an electrical insulating layer on one side, a conducting aramid layer had an electrical breakdown voltage of 12.4 kv/mm at a basis weight for the electrical insulating layer (aramid layer) of 68.5 g/m²; and an electrical breakdown voltage of 9.3 kv/mm at a basis weight of 67.8 g/m² thereof. These values were only half of the breakdown voltage of 24 kv/mm of a Table 3 control, but still these sheets gave sufficient electrically insulating properties. Although not meeting UL9-4VO, they were self-extinguishing and could be used for continued service at 220° C.

The conducting aramid sheets having electrically insulating layers on both sides thereof, at a basis weight for each electrically insulating layer (aramid layer) of 58.0 g/m² (a total basis weight of 115 g/m²), had electrical breakdown voltages of 13.11 kv/mm and 8.8 kv/mm, respectively, half of the breakdown voltage of 22 kv/mm of a control in Table 3. However, they had sufficient insulating properties and flame resistance (self-extinguishing), equivalent to UL94VO, and could be used for continuous service at 220° C. The reason that a conducting sheet having an electrically insulating layer on only one side is inferior in flame resistance to one having electrical insulating layers on both sides is perhaps due to the difference in the total unit weights of the insulating layers in the aramid sheet. These experimental examples indicate that the electrical insulating layer of a conducting aramid sheet having electrical insulated layers on one side or two sides thereof should preferably have a total basis weight of at least 115 g/m² for reaching a high degree of flame resistance.

The preferred fiber blend composition for papermaking was 15–100% by weight of Fibrid and 85–0% by weight of Flock.

TABLE 3

| Aramid Sheet Nomex: Thickness Mils | 2 | 3 | 5 | 7 | 10 |
|---|---|---|---|---|---|
| μm | 50 | 80 | 130 | 180 | 250 |
| Basis Weight, g/m² | 40 | 64 | 115 | 173 | 248 |
| Breakdown Voltage, kv/mm | 20 | 24 | 29 | 35 | 35 |
| Flame Resistance | Meets UL94VO | | | | |
| Heat Resistance | Meets UL-E34739: continued use up to 220° C. | | | | |

TABLE 4

| | Electrically Insulating Layers for Two Sides | |
|---|---|---|
| Sheet Composition After Treated With Heat and Pressure | 2.5T410/Conducting Aramid Layer/2.5T410 | 2.5T410/Conducting Aramid Layer/2.5T410 |
| Paper Laminate Construction | 6T411/Conducting Aramid Paper/6T411 | 6T411/Conducting Aramid Paper/6T411 |
| Basis Weight of Conducting Layer (50% SUS) g/m² | 47.0 | 99.1 |
| Sheet Overall Basis Weight, g/m² | 163 | 215 |
| Thickness, μm | 161 | 215 |
| Specific Gravity g/cm³ | 1.01 | 1.00 |
| Bond Strength: MD, g/inch | At Least 660 | At Least 530 |
| XD | Stock Failure | Stock Failure |
| Insulation Breakdown Voltage of Insulated Layer, kv/mm | 13.1 | 8.8 |
| Flame Resistance | Meets UL-94 VO | |
| Heat Resistance | Continuous Service Up to 220° C. | |
| Basis Weight of Total Aramid Layers, g/m² | 116.0 | 115.9 |

TABLE 4-continued

| | | |
|---|---|---|
| Basis Weight of Aramid Layer for Each Side, g/m² | 58.0 | 58.0 |

| | Electrically Insulting Sheet For One Side | |
|---|---|---|
| | Conducting Aramid Layer/3T410 Conducting Aramid Paper/7T411 | Conducting Aramid Layer/3T410 Conducting Aramid Paper/7T411 |
| Unit Weight of Conducting Layer (50% SUS) g/m² | 44.5 | 86.2 |
| Sheet Overall Basis Weight, g/m² | 113 | 154 |
| Thickness, μm | 106 | 136 |
| Density, g/cm³ | 1.07 | 1.13 |
| Bond Strength: MD, g/inch | Stock Failure | Stock Failure |
| XD | Stock Failure | Stock Failure |
| Insulation Breakdown Voltage of Insulated Layer, kv/mm | 12.4 | 9.3 |
| Flame Resistance | Self-Extinguishing | |
| Heat Resistance | Continuous Service Up to 220° C. | |
| Basis Weight of Total Aramid Layer, g/m² | 68.5 | 67.8 |
| Basis Weight of Aramid Layer for Each Side, g/m² | 68.5 | 67.8 |

EXPERIMENTAL EXAMPLE 3

In accordance with Experimental Example 1, conducting aramid papers were prepared except that the conducting aramid layer comprised SUS fibers or CF fibers in an amount of 50% by weight, 50% by weight of Fibrid, with the goal basis weights of 50 g/m² and 100 g/m², respectively.

To both sides or one side of the conducting aramid paper was laminated Nomex ® aramid paper 5T411 (5 MIL thick, unit weight 40₂ g/m²), with heat and pressure on a hot press at 300° C. under a pressure of 30 kg/cm² for 1 minute and 30 seconds to obtain a conducting aramid sheet having an electrical insulation layer on one side and a conducting aramid sheet having electrical insulation layers on both sides.

Figure 7A:
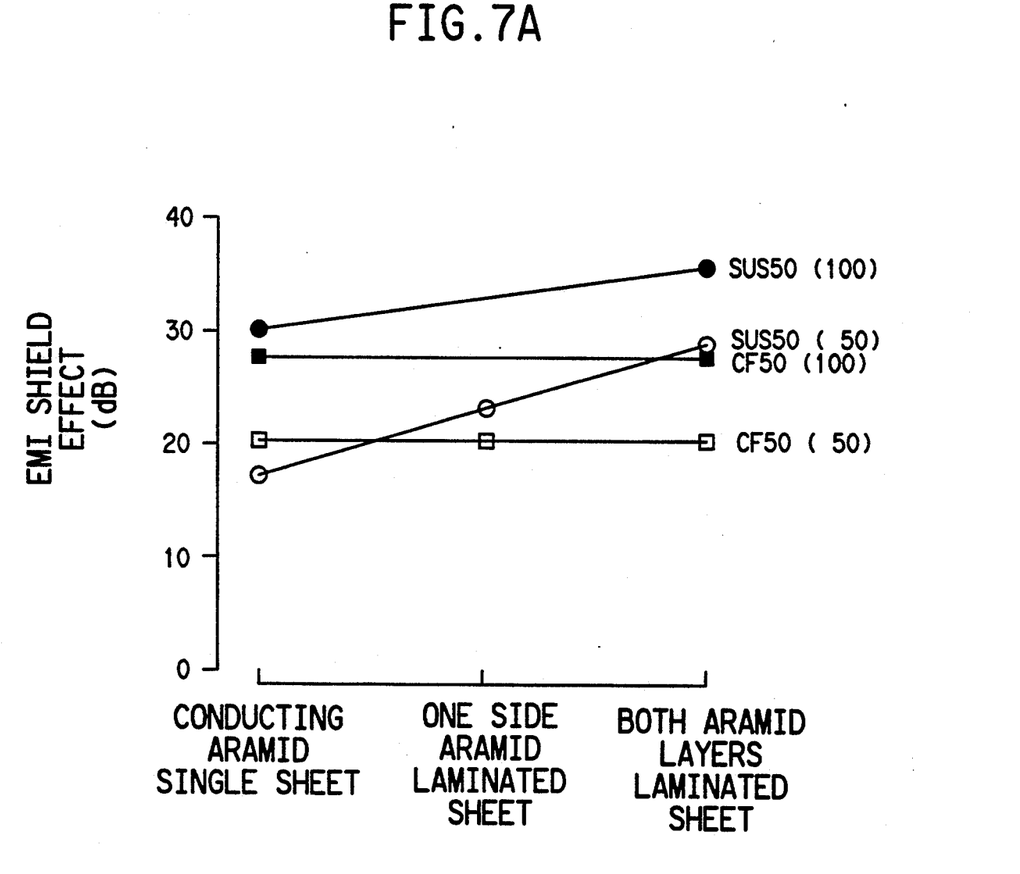
FIG. 7A and B are graphs comparing the area resistivity of conducting layers and the EMI shielding effect of sheets.
Figure 7B:
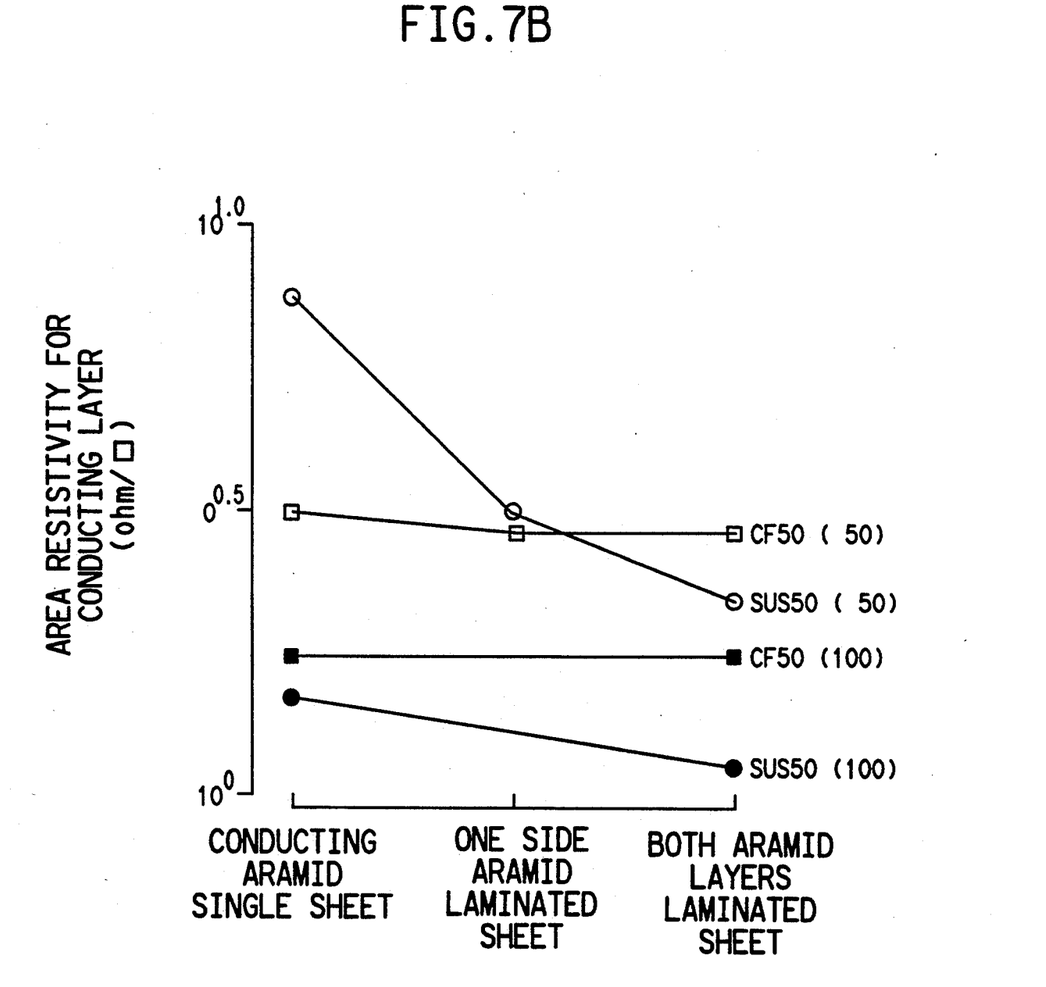

FIG. 7A and B plots the area resistivity (ohm/□) of the conducting layer of the resultant sheet and EMI shield effect (dB).

In the figure, for example, "SUS 50 (100)" stands for a conducting aramid sheet layer of 50% by weight of SUS fibers and a basis weight of 100 g/m².

FIG. 7A and B shows that in the SUS fiber-blended sheets, sheets having aramid layers on one side or both sides had higher conductivities and clearly superior EMI shielding performance than those of a single conducting aramid paper sheet.

The data also show that conductivities and EMI shield effects are improved by stacking or laminating aramid layers with heat and pressure.

That is, a single conducting aramid paper sheet is hindered from self-fusion of aramid fibers to themselves to the extent of the incorporated conducting fibers, making it difficult to maintain good contacts among the conducting fibers; this prevents the conducting fibers from effectively contributing to conductivity.

Treating with overlaid aramid layers with heat and pressure acts to securely fix the conducting fibers on the surface of a given conducting aramid layer, so as to improve mutual contacts of the conducting fibers, thereby bringing out effective conduction function of the conducting fibers.

Since the surface of a single conducting aramid paper does not fix the conducting fibers securely enough, some conducting fibers might be liable to drop off and cause a danger of short circuiting. In contrast, with at least the side facing the circuit being an aramid surface layer [in this invention], there is no possibility of the conducting fibers short circuiting.

The CF-fiber blended sheets showed no improvements in conductivities or EMI shielding effect, but at least they were effective for preventing the conducting fibers from dropping off.

As described above, conducting aramid sheets having electrically insulating layers on one side or both sides thereof effectively prevent the conducting fibers from dropping off, in addition, providing improvements in conductivities or EMI shield effect.

Figure 8:
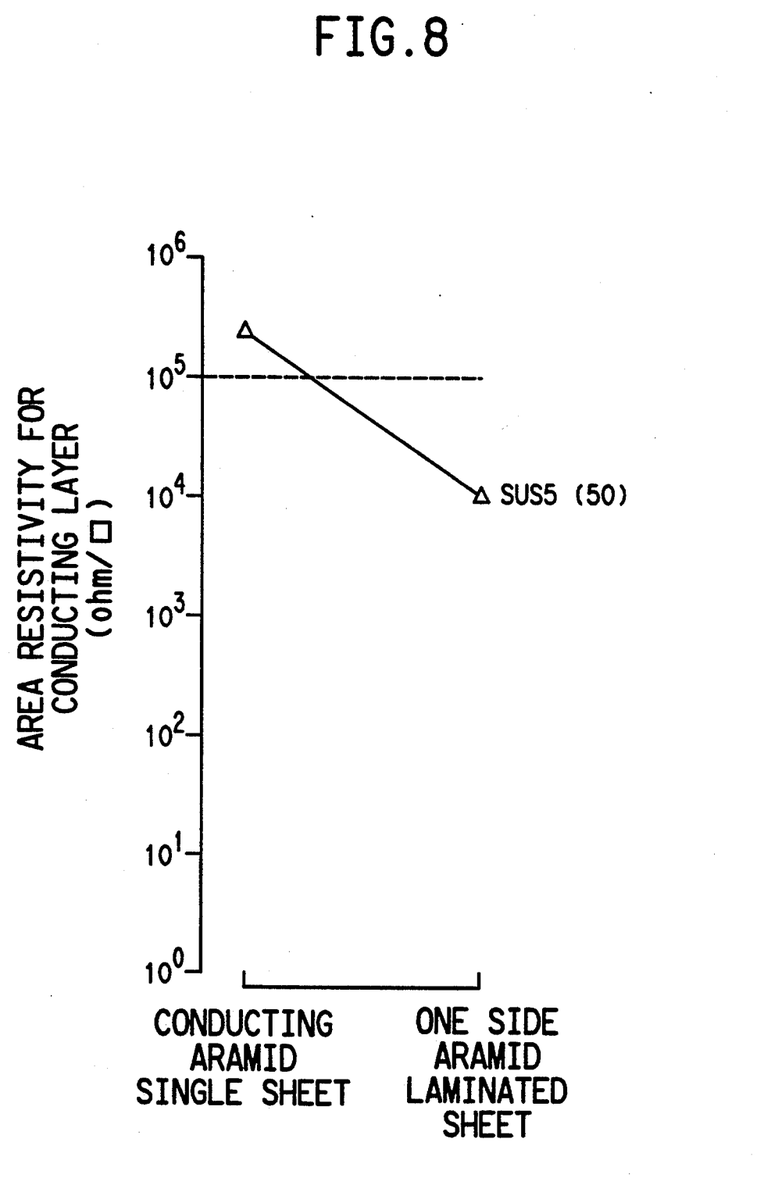
FIG. 8 is a graph showing the area resistivity of a conducting aramid layer and a conducting sheet having a conducting aramid layer laminated to one side thereof.

A conducting aramid paper was next obtained by papermaking according to a method similar to that of Example 1 except for using a stock composition of 5% by weight of SUS fibers, 35% by weight of Flock, and 60% by weight of Fibrid to a goal basis weight of 50 g/m². FIG. 8 shows area resistivity (ohm/□) values of the aramid paper itself and the conducting layer of a sheet obtained by laminating onto said aramid paper Nomex ® aramid paper 5T411 (5 MIL thick, basis weight 40 g/m² with heat and pressure.

FIG. 8 shows that a single conducting aramid paper sheet had a resistivity of at least $10^5$ ohm/□, but the conducting aramid sheet having an electrically insulating layer on one side had a resistivity of $10^4$ ohm/□. The data show that conductivities are improved even in the case in which the amount of conducting fibers incorporated is small, if laminated to an aramid sheet.

EXAMPLE 1

The conducting aramid layers used comprised 50% by weight of SUS fibers and 50% by weight of Fibrid prepared to goal basis weights of 50 g/m² and 100 g/m².

Sheets of this invention were prepared by varying paper stock preparation, papermaking, method of lamination, and method of sheet construction. The conditions used for preparing the sheets were identical to those given in Experimental Examples 1 and 2.

Table 5 summarizes the properties of the sheets of this invention.

A sheet of the construction of a one-sided electrical insulation as a conducting layer/aramid layer had an EMI shield effect of 24 dB, short of the goal 25 dB.

Increasing the basis weight of the conducting layer allowed reaching an EMI shield effect of 25 dB. All others showed good EMI shield effects, making these suitable as EMI shield sheets for electronic device circuits.

320° C. under a linear pressure of 125 kg/cm to prepare sheets for this invention.

Table 6 summarizes the sheet construction and performance.

Each sheet gave good EMI shield effect. These sheets

TABLE 5

| Conducting Layer | | | | Overall Sheet | |
|---|---|---|---|---|---|
| Conducting Fibers | | Aramid | | Basis | | | Treatment |
| Type | % Blended (wt %) | FB (wt %) | FL (wt %) | Weight (g/m$^2$) | Paper Making and Lamination | With Heat and Pressure |
| SUS | 50 | 50 | 0 | 49.4 | Combination Papermaking | Flat Sheet Press |
| SUS | 50 | 50 | 0 | 49.4 | Combination Papermaking | Flat Sheet Press |
| SUS | 50 | 50 | 0 | 93.0 | Combination Papermaking | Flat Sheet Press |
| SUS | 50 | 50 | 0 | 54.0 | Cylinder Papermaking and Lamination | Flat Sheet Press |
| SUS | 50 | 50 | 0 | 54.0 × 2 | Cylinder Papermaking and Lamination | Flat Sheet Press |
| SUS | 50 | 50 | 0 | 96.9 | Cylinder Papermaking and Lamination | Flat Sheet Press |

| | Overall Sheet | | | | | |
|---|---|---|---|---|---|---|
| Sheet Construction | Basis Weight (g/m$^2$) | Thickness ($\mu$m) | Density (g/cm$^3$) | Area Resistivity of Conducting Layer (ohm/□) | EMI Shield Effect (dB) | Peel Strength g/in |
| Conducting Layer/Aramid Layer (FB = 100%) | 101 | 105 | 0.96 | $3.80 \times 10^0$ | 24.0 | — |
| Aramid Layer (FB = 100%)/Conducting Layer/Aramid Layer (FB = 100%) | 157 | 148 | 1.07 | $2.22 \times 10^0$ | 28.0 | — |
| Aramid Layer (FB = 100%)/Conducting Layer/Aramid Layer (FB = 100%) (FB = 100%) | 171 | 176 | 0.97 | $1.38 \times 10^0$ | 35.0 | — |
| 5T411/Conducting Layer/5T411 | 134 | 131 | 1.02 | MD $1.16 \times 10^0$ XD $2.00 \times 10^0$ | 32.4 29.1 | 475 402 |
| 5T411/Conducting Layer/5T411 | 180 | 158 | 1.14 | MD $1.13 \times 10^0$ XD $1.49 \times 10^0$ | 34.6 33.1 | 459 491 |
| 5T411/Conducting Layer/5T411 | 170· | 154 | 1.10 | MD $1.44 \times 10^0$ XD $1.61 \times 10^0$ | 33.8 31.8 | 429 458 |

EXAMPLE 2

A conducting aramid paper was prepared in a manner similar to that of Example 2 for the conducting aramid layer except that it comprised 50% by weight of SUS fibers, 40% by weight of Fibrid, and 10% by weight of Flock to the goal basis weights of 50 g/m$^2$ or 100 g/m$^2$, followed by papermaking on a circular screen paper making machine.

Onto two sides or one side of the resultant conducting aramid paper was layed down Nomex ® aramid paper 6T411, or 7T411, followed by hot calendaring at showed sufficiently high electrical insulation properties, although not as good as the insulation breakdown voltage of 21.2 kv/mm of an aramid sheet of a basis weight of 66.8 g/m$^2$, a thickness of 72 micrometer, and a density of 0.93 g/cm$^3$, nearly equivalent to those of the electrical insulation layers of these sheets. These sheets were self-extinguishing in terms of flame resistance; in particular sheets with electrical insulation on both sides had high flame resistance, equivalent to UL-94VO. They also had enough heat resistance to allow service use at 220° C. These sheets were all suitable in EMI shield applications for electronic device circuits.

TABLE 6

| | Overall Sheet | | | | | |
|---|---|---|---|---|---|---|
| Weight of Conducing Layer (g/m$^2$) | Cylinder Paper Machine and Lamination | Treatment With Heat and Pressure | Sheet Construction | Basis Weight (g/m$^2$) | Thickness ($\mu$m) | Density (g/cm$^3$) |
| 47.0 | Cylinder Paper Machine Lamination | Hot Roll Calendar | 6T411/Conducting Layer [SUS50(50)]/6T411 | 163 | 161 | 1.01 |
| 99.1 | Cylinder Paper Machine Lamination | Hot Roll Calendar | 6T411/Conducting Layer [SUS50(100)]6T411 | 215 | 215 | 1.00 |
| 44.5 | Cylinder Paper Machine Lamination | Hot Roll Calendar | Conducting Layer [SUS50(45)]7T411 | 113 | 106 | 1.07 |
| 86.2 | Cylinder Paper Machine Lamination | Hot Roll Calendar | Conducting Layer [SUS50(85)]7T411 | 154 | 136 | 1.13 |

| Overall Sheet | | | | | |
|---|---|---|---|---|---|
| Area Resistivity of Conducting Layer (ohm/□) | EMI Shield Effect (dB) | Peel Strength (g/in) | Insulation Breakdown Voltage of Electrical Insulation Layer (kv/mm) | Flame Resistance | Heat Resistance |
| MD $1.73 \times 10^0$ | 32.0 | At Least 660 | 13.1 | Equivalent | Service |

TABLE 6-continued

| | | | | | |
|---|---|---|---|---|---|
| XD $2.05 \times 10^0$ | 28.7 | — | | to VL-94VO | Use at 220° C. |
| MD $1.15 \times 10^0$ | 34.5 | At Least 530 | 8.8 | Equivalent | Service |
| XD $1.53 \times 10^0$ | 33.0 | — | | to VL-94VO | Use at 220° C. |
| MD $3.39 \times 10^0$ | 24.0 | — | 12.4 | Self-Extin- | Service |
| XD $3.53 \times 10^0$ | 23.0 | — | | guishing | Use at 220° C. |
| MD $1.66 \times 10^0$ | 32.4 | — | 9.3 | Self-Extin- | Service |
| XD $1.83 \times 10^0$ | 32.1 | — | | guishing | Use at 220° C. |

EXAMPLE 3

A conducting aramid paper was prepared by a method similar to that of Example 1 from a paper stock comprising 5% by weight of SUS fibers as conducting fibers, 35% by weight of Flock, and 60% by weight of Fibrid to a goal basis weight of 50 g/m².

Said conducting aramid paper was laminated to Nomex ® aramid paper 5I411 with heat and pressure at a temperature of 300° C. under a pressure of 30 kg/cm² for 1 minute and 30 seconds to obtain a conducting sheet having an electrically insulating layer on one side. As a control, a single conducting aramid paper itself was similarly treated with heat and pressure.

The conducting sheet having an electrical insulating layer on one side had a basis weight of 134 g/m², a thickness of 131 micrometer, a specific weight of 1.03 g/cm³, and an area resistivity for conducting area of $9.23 \times 10^3$ ohm/☐, clearly exhibiting an improvement in electrical performance compared to a single control conducting aramid sheet with an area resistivity of $2.53 \times 10^5$ ohm/☐.

The sheet of this invention was capable of preventing electrostatic attraction of dust and flame resistant, making it a suitable wall material for clean rooms and for explosion-proof.

As described above, the present invention comprises aromatic metapolyamide Fibrid, Flock, and conducting fibers, with no organic material other than aramid, without any binder for the construction, thereby fully retaining the aramid's high electrical insulation, heat resistance, and flame resistance properties.

Providing an electrical insulation layer on one side or both sides [of the conducting layer] improves electrical properties compared to a single layer conducting aramid sheet. Outstanding EMI shield properties achieved with a smaller amount of conducting fibers make the sheets of this invention economical.

In addition, the present invention is superior in flexibility and fabrication performance, such as cutting compared to those obtained by bonding metal foil, and the like.

These effects make the present invention useful as ESD preventive and EMI shielding materials.

We claim:

1. A heat- and flame-resistant conductive sheet consisting of a laminate of a conductive layer from a paper stock consisting of poly-metaphenylene isophthalamide fibrids, from 0.3 to 170 g/m² conducting fibers and optionally poly-metaphenylene isophthalamide floc, said conductive layer having an area resistivity of not more than $10^5$ ohm/__ and on one or both sides of said conductive layer, an electrically insulating layer from a paper stock consisting of poly-metaphenylene isophthalamide fibrids and floc, there being no adhesive employed in the laminate.

2. A heat- and flame-resistant conductive sheet of claim 1 in which there is from 0.3 to 8 grams/m² of conducting fibers and the area resistivity of the conductive layer is not more than $10^5$ ohm/__.

3. A heat- and flame-resistant conductive sheet of claim 1 in which there is from 8 to 170 grams/m² of conducting fibers and the area resistivity of the conductive layer is not more than $3 \times 10^0$ ohm/__.

4. A heat- and flame-resistant conductive sheet of claim 1 wherein the conductive fibers are stainless steel fibers.

* * * * *